(12) United States Patent
Aleshin et al.

(10) Patent No.: US 6,813,758 B2
(45) Date of Patent: Nov. 2, 2004

(54) OPTICAL PROXIMITY CORRECTION DRIVEN HIERARCHY

(75) Inventors: Stanislav V. Aleshin, Moscow (RU); Evgueny E. Egorov, Moscow (RU); Marina Medvedeva, Moscow (RU)

(73) Assignee: LSI Logic Corporation, Milpitas, CA (US)

(*) Notice: Subject to any disclaimer, the term of this patent is extended or adjusted under 35 U.S.C. 154(b) by 220 days.

(21) Appl. No.: 10/097,419

(22) Filed: Mar. 14, 2002

(65) Prior Publication Data

US 2003/0177451 A1 Sep. 18, 2003

(51) Int. Cl.[7] ............................ G06F 17/50; G06F 19/00
(52) U.S. Cl. ............................ 716/21; 716/19; 700/182
(58) Field of Search ...................... 716/21, 19; 700/182

(56) References Cited

U.S. PATENT DOCUMENTS 5,657,235 A * 8/1997 Liebmann et al. .......... 700/182
6,470,489 B1 * 10/2002 Chang et al. ................ 716/21

OTHER PUBLICATIONS

Method and System for Constructing a Hierarchy–Driven Chip Covering for Optical Proximity Correction, Filed Dec. 20, 2002 10/327,314 Egorov et al.

* cited by examiner

Primary Examiner—A. M. Thompson
(74) Attorney, Agent, or Firm—Suiter West PC LLO

(57) ABSTRACT

The present invention is directed to an optical proximity correction driven hierarchy. A method for constructing a hierarchy of optically independent structures for use in optical proximity correction of a circuit may include receiving an integrated circuit design, the design including geometric circuit elements for providing circuit functions of an integrated circuit. At least a portion of the integrated circuit design is exploded and geometric circuit elements of the exploded integrated circuit design are gathered into optically independent classes. A search is then performed for congruency for each optically independent class.

20 Claims, 4 Drawing Sheets

US 6,813,758 B2

OPTICAL PROXIMITY CORRECTION DRIVEN HIERARCHY

FIELD OF THE INVENTION

The present invention generally relates to the field of integrated circuit design, and particularly to an optical proximity correction driven hierarchy.

BACKGROUND OF THE INVENTION

With the advance of technology and the increasing desires of consumers for increased functionality, designing integrated circuits is becoming increasingly more complicated. For example, with advanced manufacturing techniques, increasingly smaller circuit elements are utilized, enabling increased numbers of circuit elements to be included on a circuit. As the number of elements increases, measures taken to correct designs of the integrated circuit have become even more resource intensive to the point that it may take a significant amount of time to even perform one aspect of design verification, even employing multiple information handling systems.

For example, integrated circuits have a distinctive physical circuit layout employing various geometric elements to provide the circuit functionality. Typically, the physical layout is first produced in the form of a drawing and later reduced and reproduced to a solid medium. During the design of an integrated circuit, optical proximity correction (OPC) may be employed. However, with the incredible numbers of circuit elements utilized on modern integrated circuits, performing such a correction may take days.

Therefore, it would be desirable to provide a system and method for providing an optical proximity correction driven hierarchy.

SUMMARY OF THE INVENTION

Accordingly, the present invention is directed to an optical proximity correction driven hierarchy. In a first aspect of the present invention, a method for constructing a hierarchy of optically independent structures for use in optical proximity correction of a circuit includes receiving an integrated circuit design, the design including geometric circuit elements for providing circuit functions of an integrated circuit. At least a portion of the integrated circuit design is exploded and geometric circuit elements of the exploded integrated circuit design are gathered into optically independent classes. A search is then performed for congruency for each optically independent class.

In a second aspect of the present invention, a system for constructing a hierarchy of optically independent structures for use in optical proximity correction of a circuit includes a memory suitable for storing a program of instructions and a processor communicatively coupled to the memory. The program of instructions configures the processor to receive an integrated circuit design, the design including geometric circuit elements for providing circuit functions of an integrated circuit; explode at least a portion of the integrated circuit design; and gather geometry circuit elements of the exploded integrated circuit design into optically independent classes.

In a third aspect of the present invention, a method of performing optical proximity correction to a design of an integrated circuit includes receiving an integrated circuit design, the design including geometric circuit elements for providing circuit functions of an integrated circuit. A search is performed for congruency for at least two geometric circuit elements of the received integrated circuit design with an optically independent class arranged in a hierarchy of optically independent structures, wherein congruency is found, substituting the at least two geometric circuit elements with the optically independent structure.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 4, exemplary embodiments of the present invention are shown. Integrated circuits, such as microchips, silicon chips, semiconductor chips, micro-electronic devices, and the like, are miniaturized electronic devices in which a number of active and passive circuit elements may be located utilizing a body of material to perform the function of a complete circuit. Integrated circuits have a distinctive physical circuit layout employing various geometric elements to provide the circuit functionality. Typically, the physical layout is first produced in the form of a drawing and later reduced and reproduced to a solid medium.

Topography of an integrated circuit refers to a three-dimensional, layered configuration which embodies the geometry of miniature electronic circuits of an integrated circuit. A layout of an integrated circuit may include one or more cross-sectional drawings for being superimposed, the collection of which represent the complete topography of the desired integrated circuit. To fabricate the integrated circuit, a series of imaging, coating, etching and doping steps are performed. These coating and etching steps may be carried out according to various layers of photographic images. The images function as a stencil to define the design or pattern of each layer. These images are commonly referred to as integrated circuit "masks", "mask works", or "topography".

During the design of an integrated circuit, optical proximity correction (OPC) may be employed. Optical proximity correction may be used to describe a variety of reticle enhancement techniques, including lithographic enhancement whereby structures are added to circuit designs and imaged on reticle to correct for dimension and resolution variations that appear on wafers. The application of OPC to circuit designs has been shown to increase wafer yields and reliability of the integrated circuit.

When employing optical proximity correction algorithms, a hierarchy of chips is not usually the best suitable solution for optical proximity correction purposes. The present invention provides a hierarchy of optically independent structures (OIH), which may include structural references (SREFs) called in a structure that are optically independent. For instance, for a pair a SREFs CallA and CallB:

$$Distance(CallA, CallB) > Roi$$

where Roi is a radius of "optical independency", a distance from where the geometry features are believed not to interfere with each other.

Figure 1:
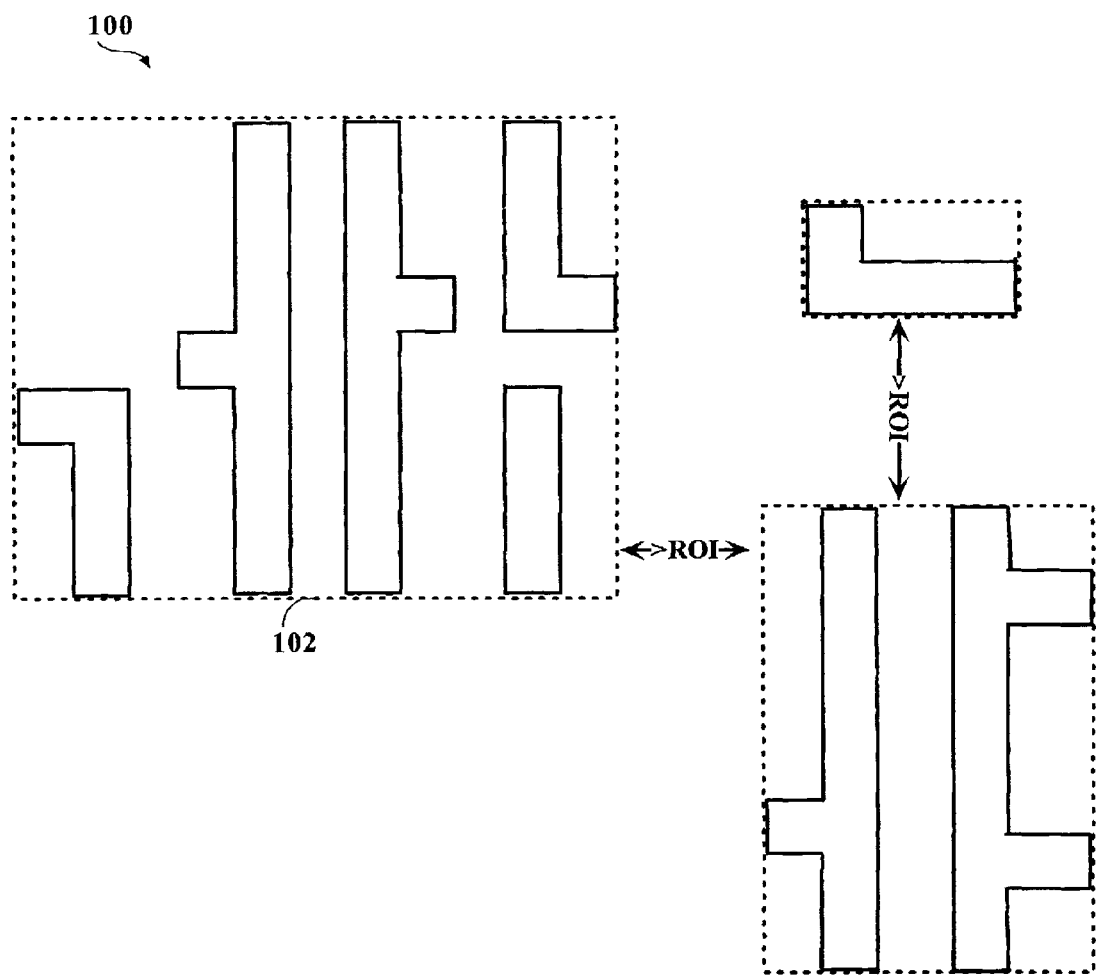
FIG. 1 is an illustration of an exemplary embodiment of the present invention wherein optically independent classes separated a radius of optical independency are shown.

For example, referring now to FIG. 1, an embodiment 100 of the present invention is shown wherein optically independent classes separated by a radius of optical independency are shown. An optically independent class 102 includes geometric elements for providing a circuit function. Thus, to provide different functions, different geometric elements may be utilized within the optically independent class.

When designing an integrated circuit, as initially designed, a circuit element may interfere with the operation of other circuit elements surrounding that element. For instance, a first element may be located at a distance which is insufficient to protect against interference with a second element. Therefore, geometric elements may be rearranged to provide at least a minimum radius of optical independency so that the elements do not interfere with each other. However, an integrated circuit may include hundreds of millions of geometric elements which require such an analysis to insure noninterference. This analysis may require a significant amount of processing time and resources to perform, and will only increase as the amount the functions and the size of the integrated circuit increase.

However, through utilization of the present invention, the different geometric elements may be utilized as optically independent classes in a hierarchy of optically independent structures (OIH) to provide optical proximity correction functionality in an improved manner.

Figure 2:
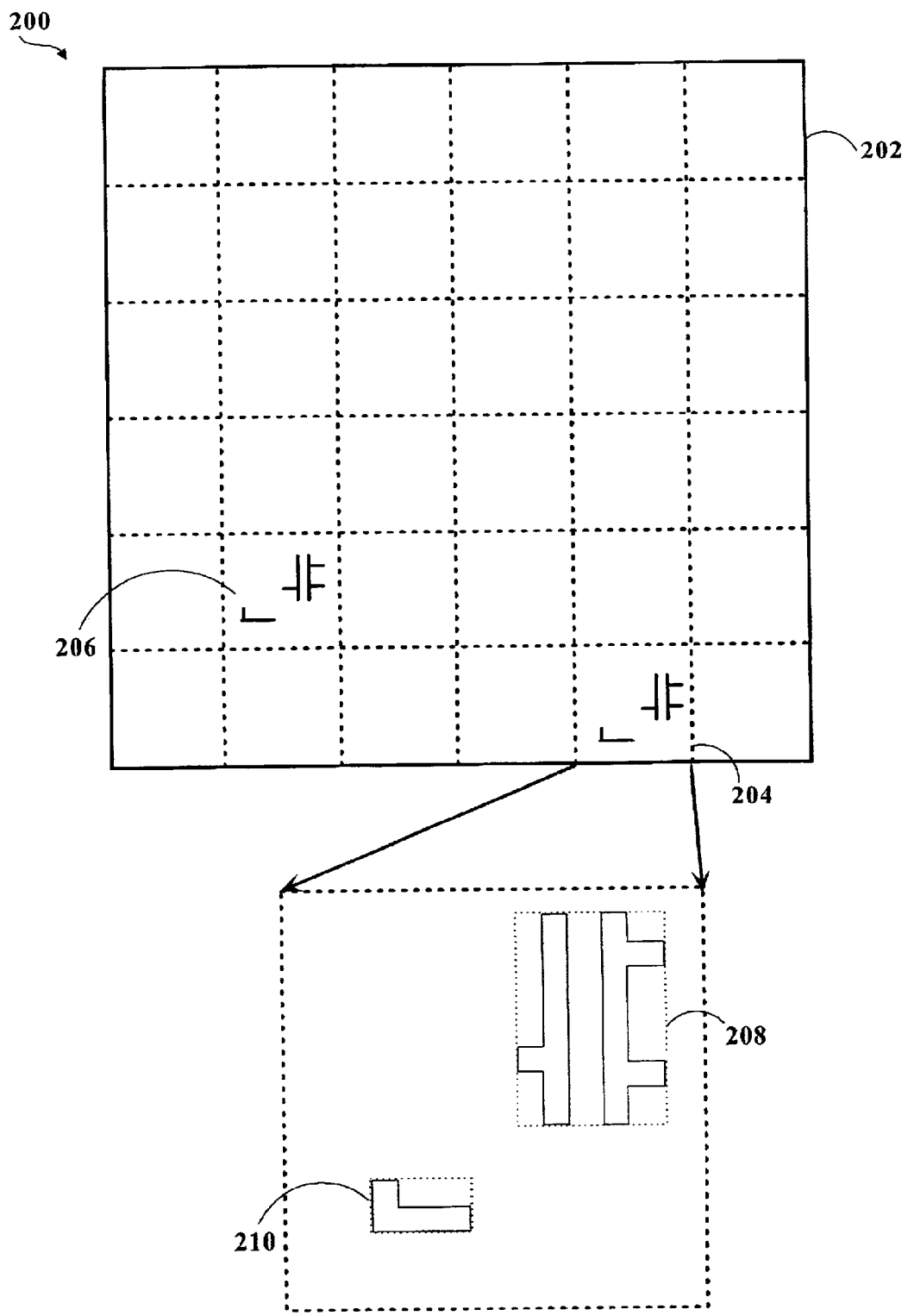
FIG. 2 is an illustration of an exemplary embodiment of the present invention wherein optically independent classes arranged in a hierarchy of optically independent structures are utilized to provide optical proximity correction.

Referring now to FIG. 2, an embodiment 200 of the present invention is shown wherein optically independent classes arranged in a hierarchy of optically independent structures are utilized to provide optical proximity correction. An integrated circuit design 202 may be divided into a plurality of partitions. The partitions may include geometric circuit elements for providing a desired function of the integrated circuit. To ensure that the geometric elements do not interfere with each other, optical proximity correction may be utilized.

Through use of the present invention, a hierarchy of optically independent structures (OIH) may be developed to supply optically corrected structures in an efficient manner. For instance, a first partition 204 may include corresponding geometric elements arranged in a manner similar to a second partition 206. Rather than optically correct both partitions separately, a first partition may be optically corrected, and the result used for both the first partition 204 and the second partition 206. In this way, the present invention may be employed in an efficient manner, thereby decreasing both processing time and resources required to get a desired result.

Additionally, cells utilized for comparison may be arranged into a hierarchy of optically independent structures. The hierarchy may be based on a variety of different factors, such as size of partition, such as how wide/deep, number of geometric elements, maximal area, and the like as contemplated by a person of ordinary skill in the art without departing from the spirit and scope thereof. For example, sub-partitions 208 & 210 may be utilized as cells for comparison and correction/replacement.

Further, cells may be compared within portions of an integrated circuit having like characteristics. For instance, in contemplated situations, placement of a geometric element on an integrated circuit may be affected differently based on positioning of the cell within the circuit. Therefore, in such a situation, cells within like portions may be compared.

Figure 3:
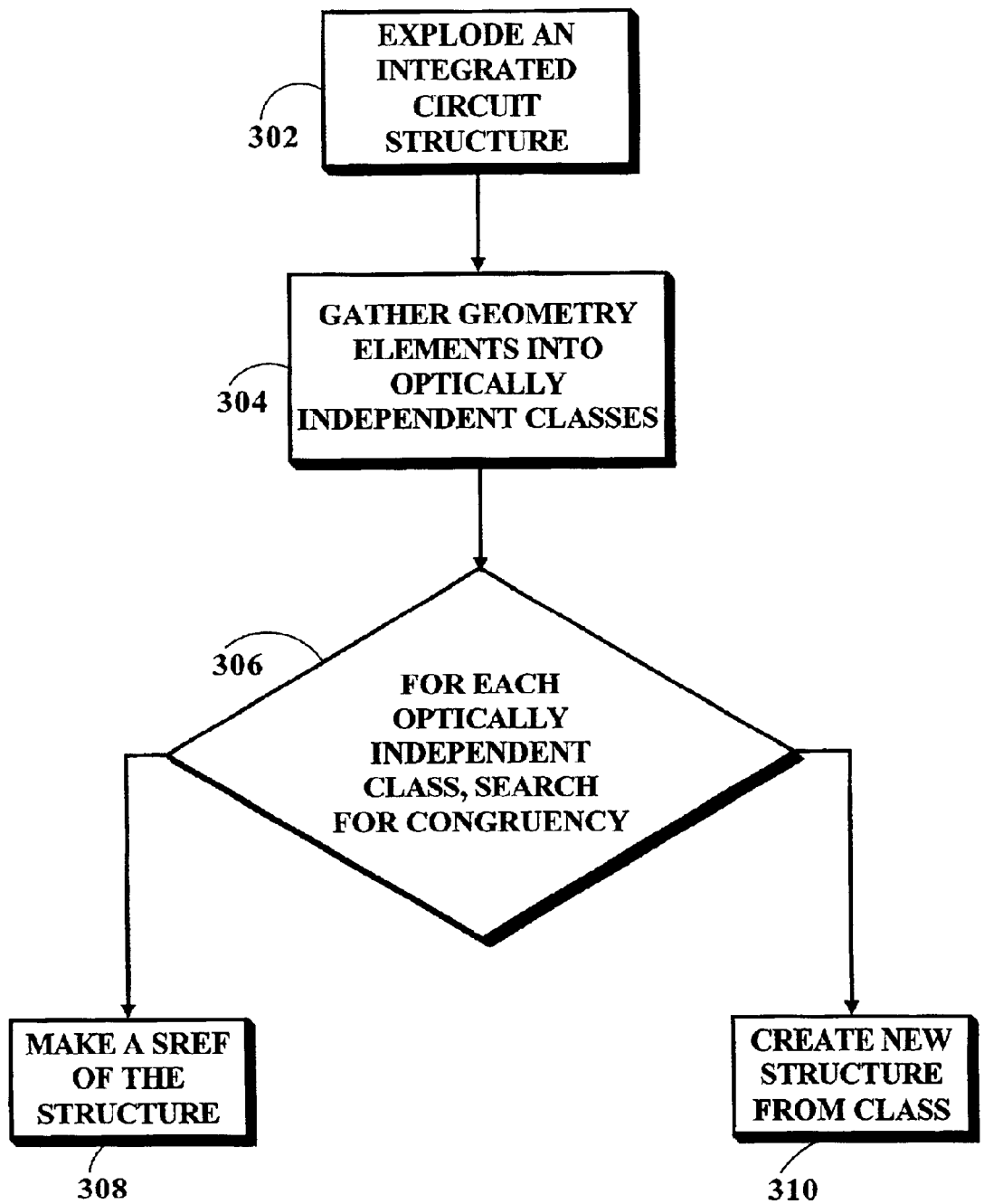
FIG. 3 is a flow diagram of an exemplary method of the present invention wherein a hierarchy of optically independent structures is created.

Referring now to FIG. 3, an exemplary method 300 of the present invention is shown wherein a hierarchy of optically independent structures is created. First, a structure of an integrated circuit is "exploded" 302, such as performing a substitution of structural references (SREFs) for identified geometry elements. The geometry elements, such as SREFs, stand-alone boundaries, and the like, are gathered into optically independent (OI) classes 304. Optically independent classes include pieces of geometry that are separated by distance Roi as previously described.

For each optically independent class, a search is performed to determine if the class is congruent to an existing structure 306. If the class is congruent to an existing structure, a structural reference is made of that structure 308. However, if the class is not congruent to an existing structure, a new structural reference is created from the class 310.

A cycle of steps, such as 1–3 steps, may be performed first for the main structure in the hierarchy. A cycle of steps, such as 1–3 steps, is then performed for the structures structurally referenced in the main structure. Then, passes may be made for the structure SREFed from those processed on the previous pass, and so on. In this way, a hierarchy of optically independent structures may be obtained.

Figure 4:
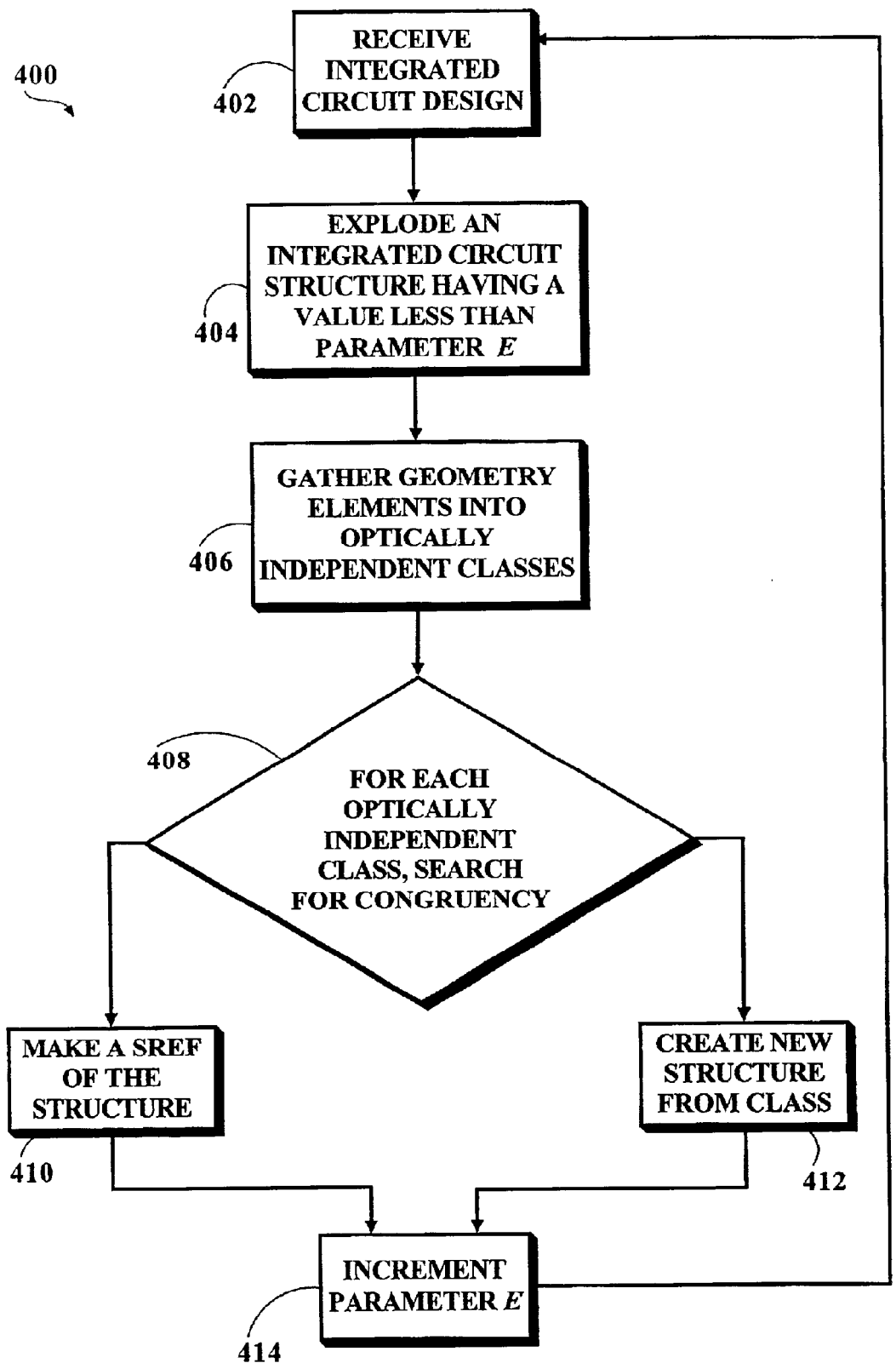
FIG. 4 is a flow diagram depicting an exemplary method of the present invention wherein a hierarchy of optically independent structures is obtained through parameter variation.

Referring now to FIG. 4, an exemplary method 400 of the present invention is shown wherein a hierarchy of optically independent structures is obtained through parameter variations. During a pass, a parameter E may be provided which controls how "wide" or "deep" the explosions would be. The next pass may then be performed with an increased E value so that structure which survived before is broken. For instance, a SREF may be exploded only if the reference structure has less than E elements, E may be the maximal area of SREFs to be exploded/substituted in a pass, and the like as contemplated by a person of ordinary skill in the art. Additionally, processing may be stopped after a number of passes, based on a time limit, and the like.

For example, an integrated circuit design may be received by a system embodying the present invention 402. An integrated circuit structure having a value less than parameter E is exploded 404. Geometry elements are then gathered into optically independent classes 406. For each optically independent class, a search is performed for congruency 408, and if found, a structural reference of the structure is made 410, such as for use in optical proximity correction of a corresponding structure. If a congruent structure is not found 408, a new structure is created from the class 412. The parameter E is then incremented 414, and the process may continue as desired. For instance, the parameter E may have increased size, increased number of structures, and the like without departing from the spirit and scope of the present invention.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the optical proximity correction drive hierarchy of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for constructing a hierarchy of optically independent structures for use in optical proximity correction of a circuit, comprising:
    receiving an integrated circuit design, the design including geometric circuit elements for providing circuit functions of an integrated circuit;
    exploding at least a portion of the integrated circuit design;
    gathering geometric circuit elements of the exploded integrated circuit design into optically independent classes; and
    searching for congruency for each optically independent class.

2. The method as described in claim 1, wherein when congruency is found for the optically independent class, making a structural reference of the congruent structure.

3. The method as described in claim 1, wherein when congruency is not found for the optically independent class, creating a new structure from the optically independent class.

4. The method as described in claim 1, wherein explosion includes substitution of structural references for geometric circuit elements, the structural references being optical proximity corrected.

5. The method as described in claim 1, wherein optically independent classes include pieces of geometric circuit elements separated by a radius of optical independency.

6. The method as described in claim 5, wherein the optically independent classes include at least two geometric circuit elements.

7. The method as described in claim 1, wherein the portion of the integrated circuit design which is exploded is defined by a parameter E.

8. The method as described in claim 7, wherein parameter E includes at least one of size of the portion exploded and number of geometric circuit elements included in the portion.

9. A system for constructing a hierarchy of optically independent structures for use in optical proximity correction of a circuit, comprising:
    a memory suitable for storing a program of instructions; and
    a processor communicatively coupled to the memory, wherein the program of instructions configures the processor to
      receive an integrated circuit design, the design including geometric circuit elements for providing circuit functions of an integrated circuit;
      explode at least a portion of the integrated circuit design; and
      gather geometry circuit elements of the exploded integrated circuit design into optically independent classes.

10. The system as described in claim 9, further comprising searching for congruency for each optically independent class.

11. The system as described in claim 10, wherein when congruency is found for the optically independent class, making a structural reference of the congruent structure.

12. The system as described in claim 10, wherein when congruency is not found for the optically independent class, creating a new structure from the optically independent class.

13. The system as described in claim 9, wherein explosion includes substitution of structural references for geometric circuit elements, the structural references being optical proximity corrected.

14. The system as described in claim 9, wherein optically independent classes include pieces of geometric circuit elements separated by a radius of optical independency.

15. The system as described in claim 14, wherein the optically independent classes include at least two geometric circuit elements.

16. The system as described in claim 9, wherein the portion of the integrated circuit design which is exploded is defined by a parameter E.

17. The system as described in claim 16, wherein parameter E includes at least one of size of the portion exploded and number of geometric circuit elements included in the portion.

18. A method of performing optical proximity correction to a design of an integrated circuit, comprising:

receiving an integrated circuit design, the design including geometric circuit elements for providing circuit functions of an integrated circuit; and searching for congruency for at least two geometric circuit elements of the received integrated circuit design with an optically independent class arranged in a hierarchy of optically independent structures, wherein congruency is found, substituting the at least two geometric circuit elements with the optically independent structure.

19. The method as described in claim 18, wherein the optically independent class includes pieces of geometric circuit elements separated by a radius of optical independency.

20. The method as described in claim 18, wherein the optically independent class arranged in the hierarchy of optically independent structures is obtained by receiving an integrated circuit design, the design including geometric circuit elements for providing circuit functions of an integrated circuit;

exploding at least a portion of the integrated circuit design;

gathering geometry circuit elements of the exploded integrated circuit design into optically independent classes; and searching for congruency for each optically independent class.

* * * * *